(12) United States Patent
Koizumi

(10) Patent No.: US 7,242,210 B2
(45) Date of Patent: Jul. 10, 2007

(54) METHOD AND APPARATUS FOR CIRCUIT BOARD INSPECTION CAPABLE OF MONITORING INSPECTION SIGNALS BY USING A SIGNAL MONITOR INCORPORATED IN THE APPARATUS

(75) Inventor: Ikuo Koizumi, Ebina (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/961,093

(22) Filed: Oct. 12, 2004

(65) Prior Publication Data

US 2005/0114746 A1 May 26, 2005

(30) Foreign Application Priority Data

Oct. 9, 2003 (JP) ............... 2003-350858

(51) Int. Cl.
*G01R 31/28* (2006.01)
*G01R 27/28* (2006.01)

(52) U.S. Cl. .............. 324/765; 324/763; 324/158.1; 714/733; 714/734; 702/120

(58) Field of Classification Search ........ 324/763–765, 324/158.1; 714/733–734; 702/120
See application file for complete search history.

(56) References Cited

U.S. PATENT DOCUMENTS

| 6,563,298 B1 * | 5/2003 | Creek et al. ............. 324/158.1 |
| 6,885,962 B2 * | 4/2005 | Yamashita .................. 702/120 |
| 6,958,619 B2 * | 10/2005 | Yamaoka et al. ........... 324/761 |
| 2002/0062461 A1 * | 5/2002 | Nee et al. ..................... 714/28 |
| 2002/0116142 A1 | 8/2002 | Yamashita |
| 2003/0028836 A1 * | 2/2003 | Maeda et al. ............... 714/724 |
| 2004/0059970 A1 * | 3/2004 | Wieberdink et al. ........ 714/724 |
| 2005/0071102 A1 * | 3/2005 | Shimizu ...................... 702/83 |

FOREIGN PATENT DOCUMENTS

| JP | 01-100474 | 4/1989 |
| JP | 2001-235505 | 8/2001 |

* cited by examiner

*Primary Examiner*—Ha Tran Nguyen
*Assistant Examiner*—Emily Y Chan
(74) *Attorney, Agent, or Firm*—Oblon, Spivak, McClelland, Maier & Neustadt, P.C.

(57) ABSTRACT

An inspection apparatus includes an interface connector, an inspection mechanism, and a monitor. The interface connector connects the inspection apparatus with an external device. The inspection mechanism inspects an inspection board using primary data sent by the external device by the interface connector, and informs the external device by the interface connector about an inspection result obtained based on secondary data corresponding to the primary data. The monitor is connected with the interface connector on a primary signal line and monitors the primary and secondary data executed concurrently with an inspecting operation of the inspection mechanism, acquires the primary and secondary data, and transmits the primary and secondary data directly to the external device by the interface connector executed concurrently with an informing operation of the inspection mechanism.

49 Claims, 3 Drawing Sheets

__US 7,242,210 B2__

METHOD AND APPARATUS FOR CIRCUIT BOARD INSPECTION CAPABLE OF MONITORING INSPECTION SIGNALS BY USING A SIGNAL MONITOR INCORPORATED IN THE APPARATUS

CROSS REFERENCE TO RELATED APPLICATIONS

The present patent document claims priority under 35 U.S.C. § 119 to Japanese Patent Application No. 2003-350858, filed on Oct. 9, 2003, in the Japanese Patent Office, the entire contents of which are hereby incorporated herein by reference.

BACKGROUND OF THE INVENTION

1. Field of the Invention

The present invention generally relates to a method and apparatus for circuit board inspection. In particular, the present invention relates to a method and apparatus for circuit board inspection capable of effectively monitoring inspection signals by using a signal monitor incorporated in the apparatus during inspection operations.

2. Discussion of the Background

Background inspection apparatuses for inspecting circuit boards compare reference data of a nondefective circuit board and a test circuit board to verify the functional accuracy of the test circuit board.

A background inspection apparatus stores measured data values of a nondefective circuit board as reference data values in a memory of the background inspection apparatus. When a test circuit board is inspected, its data values are measured and compared with the reference data values to verify the functional accuracy of the test circuit board.

In this application, statuses of signals from the nondefective circuit board may need to be monitored to determine more accurately whether the measured data values of the nondefective circuit board are correct. However, the background inspection apparatus does not have a function to monitor conditions of the signals.

Another background inspection apparatus uses a detection unit to detect a difference in a digital form between reference response pattern data obtained from a nondefective circuit board and response pattern data obtained from a test circuit board, and obtains results of comparison of these circuit boards.

Statuses of signals from the nondefective circuit board may also be needed to be monitored to determine more accurately whether the reference response pattern data of the nondefective circuit board is correct. However, the background inspection apparatus does not have a function to monitor conditions of the signals in common with the previously described background inspection apparatus.

To monitor the signals for searching defects of the above-described circuit boards and checking conditions of signals thereof, an external detection device, such as an oscilloscope and a logic analyzer, has been used. Based on signals of the circuit boards of a target product acquired with the external detection device by using probes, waveforms, logical values and times are studied to specify a position of a defect and to examine the conditions of signals. When the probes of the external detection device make contact with the test circuit board, a load of the probes' capacitor may deform the waveforms. The deformed waveforms may be different from the waveforms actually obtained in an adequate environment in which the actual external detection device is used to examine the conditions of the signals of the circuit boards. Therefore, the background inspection apparatus may have difficulty in verifying functional accuracy of the test circuit boards.

SUMMARY OF THE INVENTION

The present invention has been made in view of the above-described circumstances.

An object of the present invention is to provide an inspection apparatus capable of effectively monitoring inspection signals by using a signal monitor incorporated in the apparatus during inspection operations so that monitor signals may directly be transmitted to an external device.

Another object of the present invention is to provide an inspection apparatus capable of effectively monitoring inspection signals by using a signal monitor incorporated in the apparatus during inspection operations so that monitor signals may be transmitted to an external device through at least one counter or a memory.

Another object of the present invention is to provide a remote inspection system capable of monitoring an inspection result transmitted by an inspection apparatus connected to a device to a different device remotely connected to the device by a network.

A novel image inspection apparatus of the present invention includes an interface, an inspection mechanism, and a signal buffer mechanism. The interface is configured to interface with an external device providing at least one source signal. The inspection mechanism is configured to perform an inspection of a circuit board externally connected to the inspection mechanism using the at least one source signal sent from the external device by the interface and at least one response signal returned from the circuit board. The signal buffer mechanism is configured to monitor and store the at least one source and response signals at points of respective connection lines between the inspection mechanism and the circuit board.

The inspection mechanism may receive the at least one source signal from the external device by the interface, output the at least one source signal to the circuit board, receive the at least one response signal from the circuit board, and verify functional accuracy of the circuit board based on the at least one source and response signals.

The inspection mechanism may further be configured to transmit a result of the inspection to the external device by the interface. The signal buffer mechanism may further be configured to transmit the at least one source and response signals to the external device by the interface.

The novel inspection apparatus may further include a counter configured to repeatedly count up to a predetermined number, to receive at least one of the at least one source and response signals selectively sent from the signal buffer mechanism, and to transmit the at least one of the at least one source and response signals to the external device by the interface each time the counter counts up to the predetermined number.

The novel inspection apparatus may further include a plurality of counters, each configured to repeatedly count up to a predetermined number, to receive at least one of the at least one source and response signals selectively sent from the signal buffer mechanism, and to transmit the at least one of the at least one source and response signals to the external device by the interface each time the counter counts up to the predetermined number.

The novel inspection apparatus may further include a first counter configured to count during a predetermined time period a time length of a high-level signal in one of the at least one source and response signals selectively sent from the signal buffer mechanism and to transmit the time length of the high-level signal counted by the first counter to the external device by the interface, and a second counter configured to count during the predetermined time period a time length of a low-level signal in the one of the at least one source and response signals selectively sent from the signal buffer mechanism and to transmit the time length of the low-level signal counted by the first counter to the external device by the interface.

The novel inspection apparatus may further include a memory configured to receive signals representing the time length of the high-level signal output from the first counter and the time length of the low-level signal output from the second counter and at least one of the at least one source and response signals sent from the signal buffer mechanism, and to transmit the received signals in a predetermined screen frame to the external device by the interface.

The interface may comply with at least one of interface protocols of peripheral component interconnect, Internet security and acceleration, and personal computer memory card international association.

In one exemplary embodiment, a novel method of board inspecting includes receiving at least one source signal from an external device with an interface, performing an inspection of a circuit board using the at least one source signal originated by the external device and at least one response signal sent back from the circuit board, monitoring the at least one source and response signals, and storing the at least one source and response signals monitored by the monitoring.

The performing may include outputting the at least one source signal to the circuit board, receiving the at least one response signal from the circuit board, and verifying functional accuracy of the circuit board.

The novel method may further include transmitting a result of the inspection performed by the performing to the external device by the interface, and sending the at least one source and response signals to the external device by the interface.

The novel method may further include counting up to a predetermined number, and transmitting the at least one of the at least one source and response signals to the external device by the interface each time the counting performs counting up to the predetermined number.

The novel method may further include counting up to a predetermined number, and transmitting at least two of the at least one source and response signals to the external device by the interface each time the counting performs counts up to the predetermined number.

The novel method may further include counting during a predetermined time period a time length of a high-level signal in one of the at least one source and response signals and a time length of a low-level signal in the one of the at least one source and response signals, and transmitting signals representing the time lengths of the high-level and the low-level signals counted by the counting to the external device by the interface.

The novel method may further include receiving signals representing the time lengths of the high-level and low-level signals output from the counting and the corresponding one of the at least one source and response signals, and sending the received signals in a predetermined screen frame to the external device by the interface.

In one exemplary embodiment, a novel remote inspection system includes a first data terminal connected to a network, a second data terminal connected to the network and originating at least one source signal, and an inspection apparatus connected to the second data terminal. The inspection apparatus includes an interface configured to interface with a second data terminal originating at least one source signal, an inspection mechanism configured to perform an inspection of a circuit board externally connected to the inspection mechanism using the at least one source signal sent from the second data terminal by the interface and at least one response signal returned from the circuit board, and a signal buffer mechanism configured to monitor and store the at least one source and response signals at points of respective connection lines between the inspection mechanism and the circuit board.

The inspection mechanism may receive the at least one source signal from the second data terminal by the interface, output the at least one source signal to the circuit board, receive the at least one response signal from the circuit board, and verify functional accuracy of the circuit board based on the at least one source and response signals.

The inspection mechanism may further be configured to transmit a result of the inspection to the second data terminal by the interface. The signal buffer mechanism may further be configured to transmit the at least one source and response signals to the second data terminal by the interface.

The inspection apparatus may further include a counter configured to repeatedly count up to a predetermined number, to receive at least one of the at least one source and response signals selectively sent from the signal buffer mechanism, and to transmit the at least one of the at least one source and response signals to the second data terminal by the interface each time the counter counts up to the predetermined number.

The inspection apparatus may further include a plurality of counters, each configured to repeatedly count up to a predetermined number, to receive at least one of the at least one source and response signals selectively sent from the signal buffer mechanism, and to transmit the at least one of the at least one source and response signals to the second data terminal by the interface each time the counter counts up to the predetermined number.

The inspection apparatus may further include a first counter configured to count during a predetermined time period a time length of a high-level signal in one of the at least one source and response signals selectively sent from the signal buffer mechanism and to transmit the time length of the high-level signal counted by the first counter to the second data terminal by the interface, and a second counter configured to count during the predetermined time period a time length of a low-level signal in the one of the at least one source and response signals selectively sent from the signal buffer mechanism and to transmit the time length of the low-level signal counted by the first counter to the second data terminal by the interface.

The inspection apparatus may further include a memory configured to receive signals representing the time length of the high-level signal output from the first counter and the time length of the low-level signal output from the second counter and at least one of the at least one source and response signals sent from the signal buffer mechanism, and to transmit the received signals in a predetermined screen frame to the second data terminal by the interface.

In one exemplary embodiment, a novel method of remote board inspection includes connecting a first data terminal providing a request, to a network, connecting a second data terminal providing at least one source signal in accordance with the request from the first data terminal, to the network, providing an inspection apparatus connected to the second data terminal, receiving the at least one source signal from the second data terminal with an interface, performing an inspection of a circuit board using the at least one source signal originated by the second data terminal and at least one response signal sent back from the circuit board, monitoring the at least one source and response signals, and storing the at least one source and response signals monitored by the monitoring.

The performing may include outputting the at least one source signal to the circuit board, receiving the at least one response signal from the circuit board, and verifying functional accuracy of the circuit board.

The novel method of remote board inspection may further include transmitting a result of the inspection performed by the performing to the second data terminal by the interface, and sending the at least one source and response signals to the second data terminal by the interface.

The novel method of remote board inspection may further include counting up to a predetermined number, and transmitting the at least one of the at least one source and response signals to the second data terminal by the interface each time the counting performs counting up to the predetermined number.

The transmitting may transmit at least two of the at least one source and response signals to the second data terminal by the interface each time the counting performs counting up to the predetermined number.

The novel method of remote board inspection may further include counting during a predetermined time period a time length of a high-level signal in one of the at least one source and response signals and a time length of a low-level signal in the one of the at least one source and response signals, and transmitting signals representing the time lengths of the high-level and the low-level signals counted by the counting to the second data terminal by the interface.

The novel remote board inspection may further include receiving signals representing the time lengths of the high-level and low-level signals output from the counting and the corresponding one of the at least one source and response signals, and sending the received signals in a predetermined screen frame to the second data terminal by the interface.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
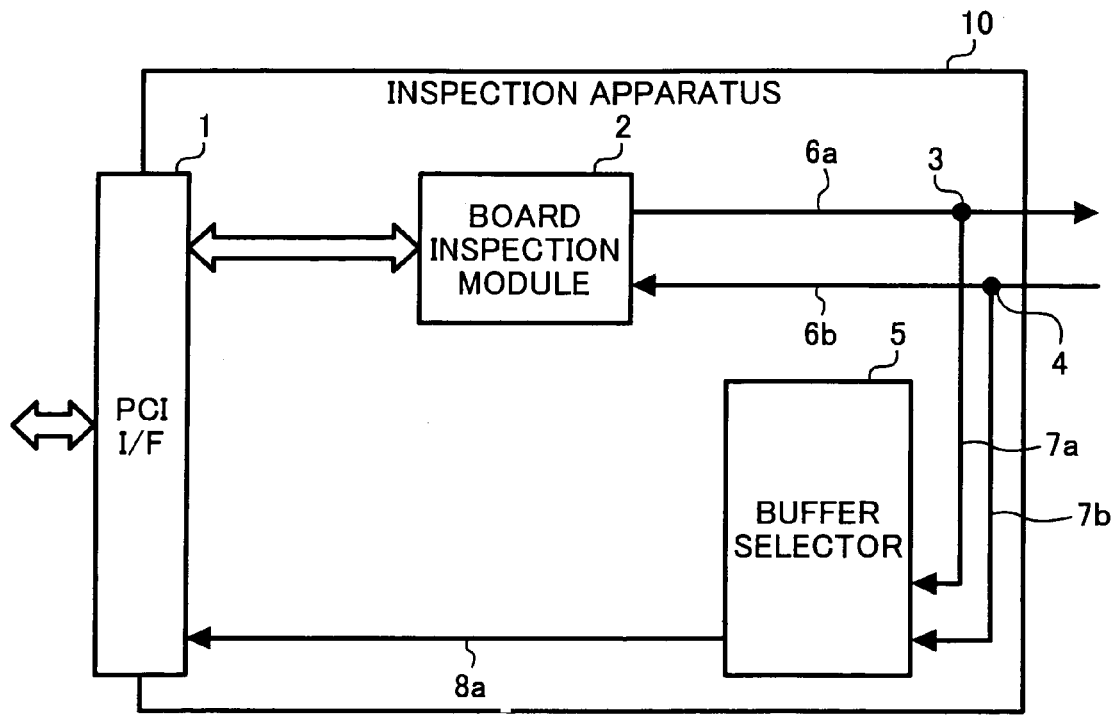
FIG. 1 is an illustration of a structure of an inspection apparatus incorporating a signal monitor according to an exemplary embodiment of the present invention.

Referring now to the drawings, wherein like reference numerals designate identical or corresponding parts throughout the several views.

In describing preferred embodiments illustrated in the drawings, specific terminology is employed for the sake of clarity. However, the disclosure of the present invention is not intended to be limited to the specific terminology so selected, and it is to be understood that each specific element includes all technical equivalents that operate in a similar manner.

Referring now to the drawings, wherein like reference numerals designate identical or corresponding parts throughout the several views, preferred embodiments of the present invention are described.

Referring to FIG. 1, a block diagram of a system structure of an inspection apparatus 10 according to an exemplary embodiment of the present invention is described.

In FIG. 1, the inspection apparatus 10 includes a peripheral component interconnect (PCI) interface connector 1, a board inspection module 2, an external output terminal 3, an external input terminal 4, a buffer selector 5, and signal lines 6a, 6b, 7a, 7b, and 8a.

The peripheral component interconnect (PCI) interface connector 1, which is hereinafter referred to as a "PCI interface 1", is an interface connector complying with a protocol under a peripheral component interconnect (PCI). Other interface connectors complying with different protocols, such as Internet security and acceleration (ISA) and personal computer memory card international association (PCMCIA), as non-limiting examples, are also available and could be utilized.

The board inspection module 2 works as an inspection mechanism. The board inspection module 2 communicates with external devices including an external personal computer (PC) (not shown) by the PCI interface 1 and with circuit boards including a test circuit board (not shown) connected on the signal lines 6a and 6b by the external output and input terminals 3 and 4, respectively, and verifies functional accuracy of the test circuit board. Each of the external output and input terminals 3 and 4 is a bundle of signal lines and can transmit a plurality of signals.

The external output terminal 3 is used to output test data sent from the board inspection module 2 on the signal line 6a.

The external input terminal 4 is used to input response data, which is processed by the test circuit board based on the test data, to the board inspection module 2 on the signal line 6b.

The buffer selector 5 works as a monitor of the inspection apparatus 10 and is incorporated in the inspection apparatus 10. The buffer selector 5 monitors a series of signals of the test data and the response data, acquires these signals as monitor signals, and transmits these signals to the external PC by the PCI interface 1.

Operations of the inspection apparatus 10 of FIG. 1 are described below.

When the external PC sends test data for inspection of the test circuit board, the board inspection module 2 of the inspection apparatus 10 receives the test data by the PCI interface 1. The board inspection module 2 then outputs the test data to the test circuit board by the external output terminal 3 on the signal line 6a. The test circuit board operates according to the test data, and replies response data to the board inspection module 2 on the signal line 6b by the external input terminal 4. When the board inspection module 2 receives the response data from the test circuit board by the external input terminal 4, the board inspection module 2 verifies, according to the response data, whether the test circuit board accurately functions or not.

While the board inspection module 2 performs data transmission with the test circuit board by the external output and input terminals 3 and 4 on the signal lines 6a and 6b, respectively, the buffer selector 5 keeps monitoring the above-described data transmission, acquires a series of signals of the test data at the external output terminal 3 on the signal line 7a and a series of signals of the response data at the external input terminal 4 on the signal line 7b, and directly transmits these signals as monitor signals on the signal line 8a to the external PC by the PCI interface 1.

After receiving the monitor signals, the external PC runs a predetermined software to display conditions of the monitor signals on a screen (not shown) of a display unit (not shown) of the external PC, for example. By doing so, the conditions of the monitor signals become visible on the screen, and users including an examiner may determine whether the test data output to the test circuit board by the board inspection module 2 of the inspection apparatus 1 is correct or not.

When obtaining a determination result that the test circuit board has a defect, the board inspection module 2 transmits the above-described determination result to the external PC by the PCI interface 1. At the same time, the buffer selector 5 incorporated in the inspection apparatus 10 monitors conditions of the monitor signals input from the test circuit board to the board inspection module 2 on the signal line 6b by the external input terminal 4, acquires the monitor signals at the external input terminal 4 by bypassing with the signal line 7b, and directly transmits the monitor signals to the external PC by the PCI interface 1. By directly transmitting the monitor signals from the buffer selector 5, the external PC may show the conditions of the monitor signals on the screen and the examiner may easily find out details of the defect.

The buffer selector 5 can constantly monitor the signals on the external output and input terminals 3 and 4, regardless of whether the operations of the board inspection module 2 are stopped. That is, when the operations of the board inspection module 2 are stopped during, for example, the data transmission between the board inspection module 2 and the test circuit board by the external output and input terminals 3 and 4, the buffer selector 5 monitors the conditions of the signals on the external output terminal 3 and the response signals on the external input terminal 4. The buffer selector 5 then transmits these signals directly to the external PC by the PCI interface 1 so that the conditions of the monitor signals may be displayed on the screen of the external PC. By displaying the monitor signals on the screen of the external PC, the examiner may monitor the conditions of the monitor signals.

With the above-described structure, the inspection apparatus 10 may monitor the signals in inoperable conditions such as a malfunction and stall of the test circuit board, without using external detection devices. That is, with the buffer selector 5 incorporated in the inspection apparatus 10, the inspection apparatus 10 may test the signals without using probes connected to the detection device, thereby preventing unnecessary deformation of waveforms caused by a load of the probes' capacitor.

Figure 2:
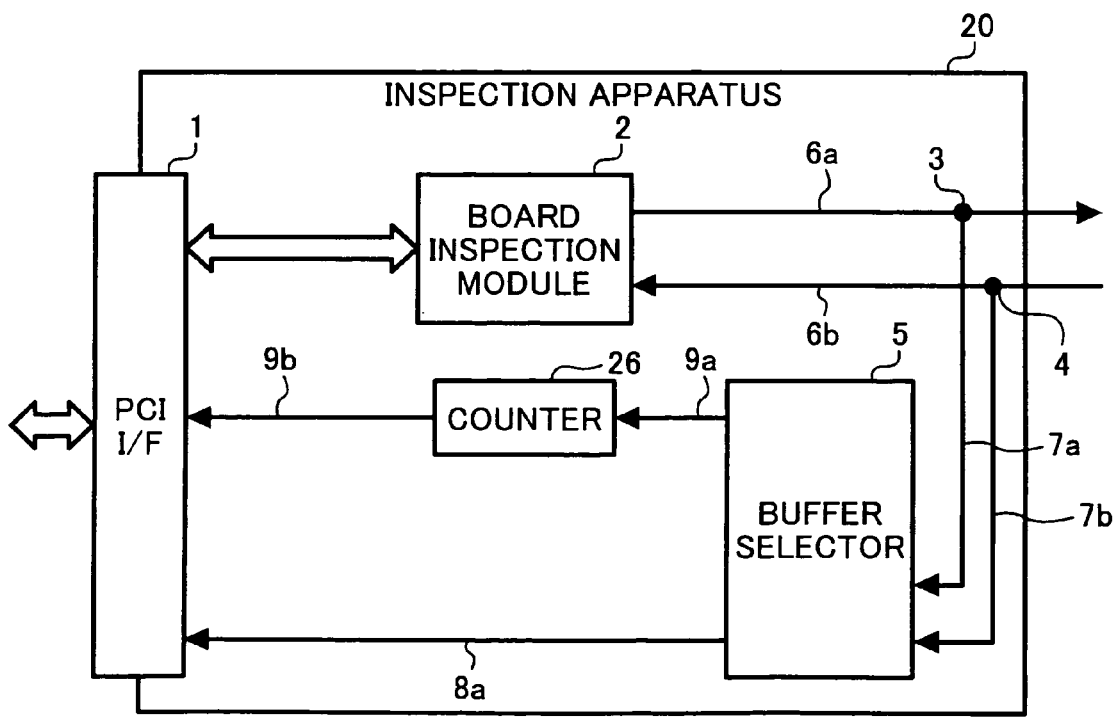
FIG. 2 is an illustration of another structure of an inspection apparatus incorporating a signal monitor according to another exemplary embodiment of the present invention.

Referring to FIG. 2, a block diagram of a system structure of an inspection apparatus 20 according to another exemplary embodiment of the present invention is described.

In FIG. 2, the inspection apparatus 20 includes the peripheral component interconnect interface connector (PCI interface) 1, the board inspection module 2, the external output terminal 3, the external input terminal 4, the buffer selector 5, the signal lines 6a, 6b, 7a, 7b, 8a, signal lines 9a and 9b, and a counter 26.

The above-described components of the inspection apparatus 20, shown in FIG. 2, are similar to the components of the inspection apparatus 10, shown in FIG. 1, with the exception of the counter 26 and the signal lines 9a and 9b.

The counter 26 operates between the PCI interface 1 and the buffer selector 5. The signal lines 9a and 9b are provided in addition to the signal line 8a that directly connects the buffer selector 5 with the PCI interface 1 of FIG. 1.

Operations of the inspection apparatus 20 shown in FIG. 2 are also similar to those of the inspection apparatus 10 shown in FIG. 1 except for a series of operations related to the counter 26 and the signal lines 9a and 9b.

After acquiring the monitor signals including the test data and the response data, the buffer selector 5 sequentially transmits the monitor signals to the external PC by the PCI interface 1 on the signal lines 8a and 9a. The monitor signals on the signal line 8a are directly transmitted to the external PC by the PCI interface 1. For the monitor signals on the signal line 9a, the counter 26 counts the monitor signals at intervals of a predetermined number of counts, and outputs the monitor signals to the external PC by the PCI interface 1.

By controlling transmission of the monitor signals as described above, it is determined whether the monitor signals are dynamic or static. The monitor signals include a dynamic signal and a static signal. When the monitor signals are dynamic, that is when the monitor signals repeat a high level condition and a low level condition, it is determined that the test circuit board functions well. When the monitor signals are static, that is when the monitor signals stay in one of the high level condition and low level condition, it is determined that the test circuit board may have a problem.

With the above-described structure of FIG. 2, in addition to the operations performed in the inspection apparatus 10 of FIG. 1, the inspection apparatus 20 having a monitoring function therein may have the counter 26 count the monitor signals at intervals of the predetermined number of counts so that it is determined whether the monitor signals repeat a high level condition and a low level condition, thereby facilitating debugging and analyzing the test circuit board.

Figure 3:
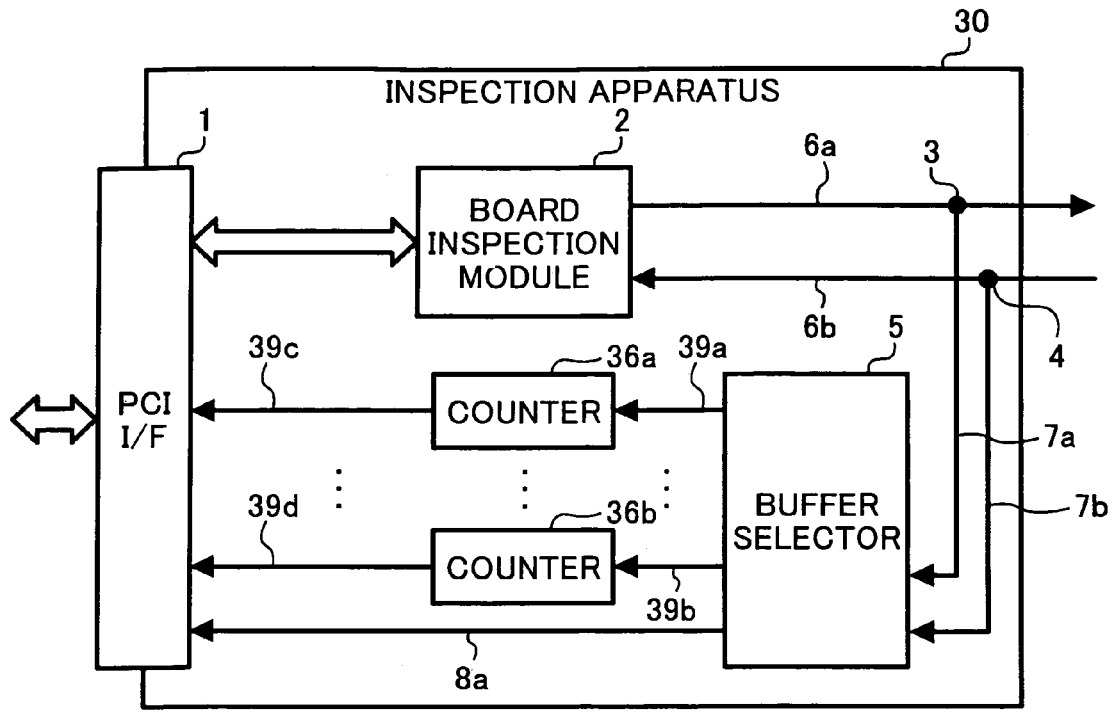
FIG. 3 is an illustration of another structure of an inspection apparatus incorporating a signal monitor according to another exemplary embodiment of the present invention.

Referring to FIG. 3, a block diagram of a system structure of an inspection apparatus 30 according to another exemplary embodiment of the present invention is described.

In FIG. 3, the inspection apparatus 30 includes the peripheral component interconnect interface connector (PCI interface) 1, the board inspection module 2, the external output terminal 3, the external input terminal 4, the buffer selector 5, a plurality of counters including counters 36a and 36b, signal lines 6a, 6b, 7a, 7b and 8a, and different signal lines 39a, 39b, 39c and 39d.

The above-described components of the inspection apparatus 30, shown in FIG. 3, are similar to the components of the inspection apparatus 10, shown in FIG. 1, with the exception of the plurality of counters including the counters 36a and 36b, and the signal lines 39a, 39b, 39c and 39d. Since the plurality of counters have similar structures to each other, the following descriptions will be made focusing on the counters 36a and 36b.

The counters 36a and 36b operate between the PCI interface 1 and the buffer selector 5 on the respective signal lines 39a, 39b, 39c and 39d. The respective signal lines 39a, 39b, 39c and 39d are provided in addition to the previously provided signal lines 6a, 6b, 7a, 7b and 8a.

Operations of the inspection apparatus 30 shown in FIG. 3 are also similar to those of the inspection apparatus 10 shown in FIG. 1, except for a series of operations related to the counters 36a and 36b, and the signal lines 39a, 39b, 39c and 39d.

After acquiring the monitor signals including the test data and the response data, the buffer selector 5 sequentially transmits the monitor signals to the external PC by the PCI interface 1. The counters 36a and 36b count the monitor signals from the buffer selector 5 at intervals of a predetermined number of counts, and output the respective monitor signals to the external PC by the PCI interface 1.

As previously described, the counters 36a and 36b have similar structures, thereby simultaneously performing operations identical to each other. By providing the plurality of counters for simultaneously performing identical operations, a plurality of monitor signals can be monitored and latched. When the plurality of monitor signals are transmitted to the external PC by the PCI interface 1, the external PC can effectively determine whether any of the plurality of monitor signals are delayed.

With the above-described structure of FIG. 3, in addition to the operations performed in the inspection apparatus 10 of FIG. 1, the inspection apparatus 30 having a monitoring function therein may effectively determine occurrence of signal delay of the monitor signals transmitted from the buffer selector 5.

Figure 4:
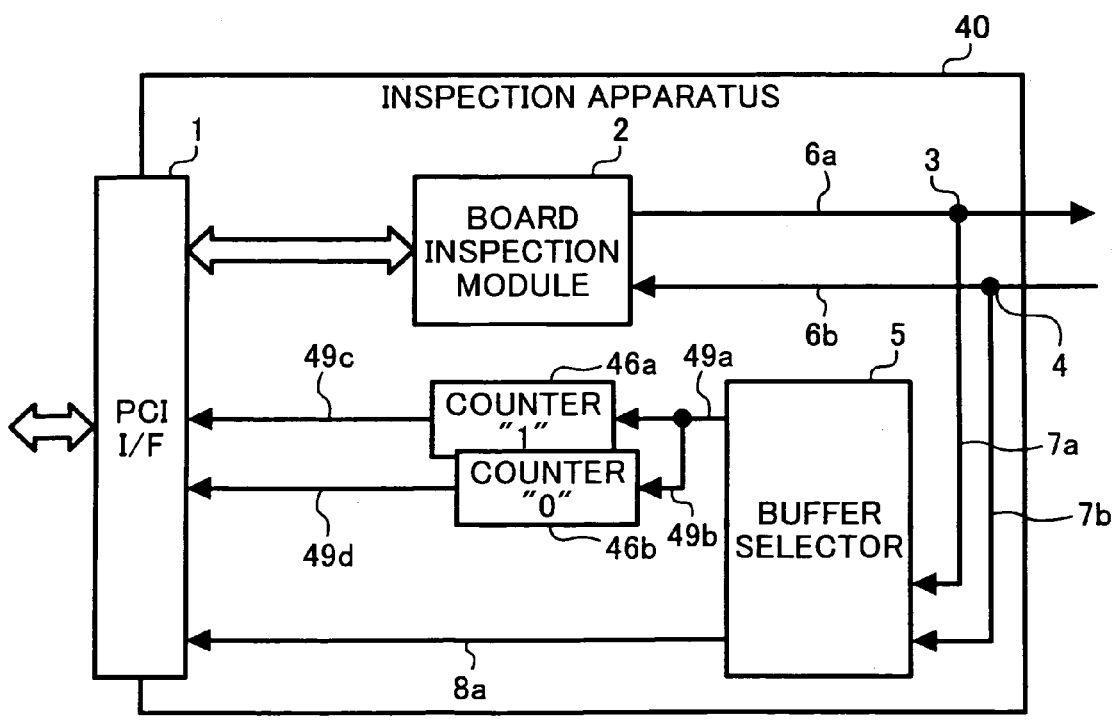
FIG. 4 is an illustration of another structure of an inspection apparatus incorporating a signal monitor according to another exemplary embodiment of the present invention.

Referring to FIG. 4, a block diagram of a system structure of an inspection apparatus 40 according to another exemplary embodiment of the present invention is described.

In FIG. 4, the inspection apparatus 40 includes the peripheral component interconnect interface connector (PCI interface) 1, the board inspection module 2, the external output terminal 3, the external input terminal 4, the buffer selector 5, a first counter 46a and a second counter 46b, the signal lines 6a, 6b, 7a, 7b and 8a, and different signal lines 49a, 49b, 49c and 49d.

The above-described components of the inspection apparatus 40, shown in FIG. 4, are similar to the components of the inspection apparatus 10, shown in FIG. 1, with the exception of the first and second counters 46a and 46b, and the signal lines 49a, 49b, 49c and 49d.

The first and second counters 46a and 46b operate between the PCI interface 1 and the buffer selector 5. The signal lines 49a, 49b, 49c and 49d are provided in addition to the signal line 8a that directly connects the buffer selector 5 with the PCI interface 1 of FIG. 1. The signal lines 49a and 49b are originally one signal line that has been divided into two signal lines branched between the buffer selector 5 and the first and second counters 46a and 46b, and the signal lines 49c and 49d are extended to the PCI interface 1.

Operations of the inspection apparatus 40 shown in FIG. 4 are also similar to those of the inspection apparatus 10 shown in FIG. 1, except for a series of operations related to the first and second counters 46a and 46b, and the signal lines 49a, 49b, 49c and 49d.

After acquiring the monitor signals including the test data and the response data, the buffer selector 5 sequentially transmits the monitor signals to the external PC by the PCI interface 1 on the signal lines 8a, 49a and 49b. The monitor signals on the signal line 8a are directly transmitted to the external PC by the PCI interface 1. For the monitor signals on the signal lines 49a and 49b, the first and second counters 46a and 46b respectively count the monitor signals, and output the monitor signals to the external PC by the PCI interface 1. The first counter 46a counts high-level signals having a value "1", increments the number of high-level signals among the monitor signals that are output from the buffer selector 5 during a predetermined period of time, and provides a result of the counting to the external PC by the PCI interface 1. The second counter 46b counts low-level signals having a value "2", increments the number of low-level signals among the monitor signals that are output from the buffer selector 5 during a predetermined period of time, and provides a result of the counting to the external PC by the PCI interface 1.

By providing the first and second counters 46a and 46b, a plurality of monitor signals may be monitored. In addition, the external PC may obtain each duty of the high-level signals and the low-level signals acquired by the buffer selector 5. When the duties of the high-and low-level signals of the monitor signals are transmitted to the external PC by the PCI interface 1, the external PC may effectively determine the duties of the monitor signals acquired by the buffer selector 5.

With the above-described structure of FIG. 4, in addition to the operations performed in the inspection apparatus 10 of FIG. 1, the inspection apparatus 40 having a monitoring function therein may effectively monitor the plurality of monitor signals and determine the duties of the high-level and low-level signals of the monitor signals that are acquired by the buffer selector 5.

Figure 5:
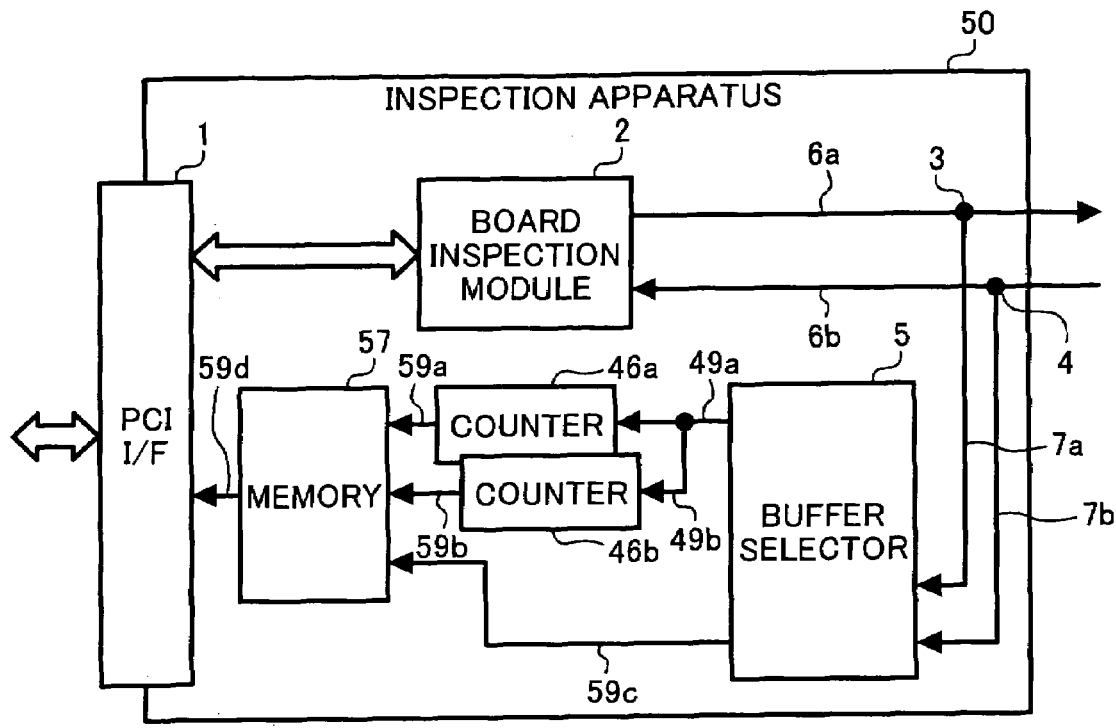
FIG. 5 is an illustration of another structure of an inspection apparatus incorporating a signal monitor according to another exemplary embodiment of the present invention.

Referring to FIG. 5, a block diagram of a system structure of an inspection apparatus 50 according to another exemplary embodiment of the present invention is described.

In FIG. 5, the inspection apparatus 50 includes the peripheral component interconnect interface connector (PCI interface) 1, the board inspection module 2, the external output terminal 3, the external input terminal 4, the buffer selector 5, the first counter 46a, the second counter 46b, a memory 57, the signal lines 6a, 6b, 7a, 7b, 49a and 49b, and different signal lines 59a, 59b, 59c and 59d.

The above-described components of the inspection apparatus 50, shown in FIG. 5, are similar to the components of the inspection apparatus 40, shown in FIG. 4, with the exception of the memory 57, and the signal lines 59a, 59b, 59c and 59d.

The memory 57 operates between the PCI interface 1 and the buffer selector 5 and the first and second counters 46a and 46b. The signal lines 59a, 59b, 59c and 59d are provided for signal transmission with respect to the memory 57. The memory 57 receives the monitor signals from the buffer selector 5 on the signal line 59c, from the counter 46a on the signal line 59a, and from the counter 46b on the signal line 59b, and transmits the monitor signals to the PCI interface 1 on the signal line 59d.

Operations of the inspection apparatus 50 shown in FIG. 5 are also similar to those of the inspection apparatus 40 shown in FIG. 4, except for a series of operations related to the memory 57 using the signal lines 59a, 59b, 59c and 59d.

The memory 57 receives respective monitor signals from the first counter 46a, the second counter 46b and the buffer selector 5 on the respective signal lines 59a, 59b and 59c therebetween, so as to store the respective monitor signals. The memory 57 then transmits a predetermined amount of monitor signals stored therein on the signal line 59d connected with the PCI interface 1, to the external PC.

Detailed operations of the memory 57 are as follows. The memory 57 samples the monitor signals of the first and second counters 46a and 46b based on clock pulses, for example, and stores a predetermined amount of data of the thus sampled monitor signals to a first-in first-out (FIFO) buffer of the buffer selector 5. When the predetermined amount of data is 64 bit, for example, according to a fact that the memory 57 has a length of 64 bit per line, the memory 57 obtains the sampled monitor signals and temporarily stores up to the 64 bit data of the sampled monitor signals as one line, to the FIFO buffer. The memory 57 repeats the above-described serial operations. Further, at the moment the lines of data stored in the FIFO buffer become equal to a predetermined amount and ready for a burst transmission, the memory 57 transmits a request to the external PC to write the data of the sampled monitor signals, and repeats the operation for a previously set period of time.

By providing the memory 57 after the buffer selector 5 and the first and second counters 46a and 46b, the data separately obtained from the buffer selector 55 and the first and second counters 46a and 46b may be stored in the memory 57 together and transmitted by a predetermined amount to the external PC by the PCI interface 1.

With the above-described structure of FIG. 5, in addition to the operations performed in the inspection apparatus 10 of FIG. 1, the inspection apparatus 50 having a monitoring function therein may transmit the data of the conditions of the monitor signals stored in the memory 57 to the external PC so that the external PC can show the data of its time base on the screen, for example, to perform as a signal monitor and a logic tracer.

Figure 6:
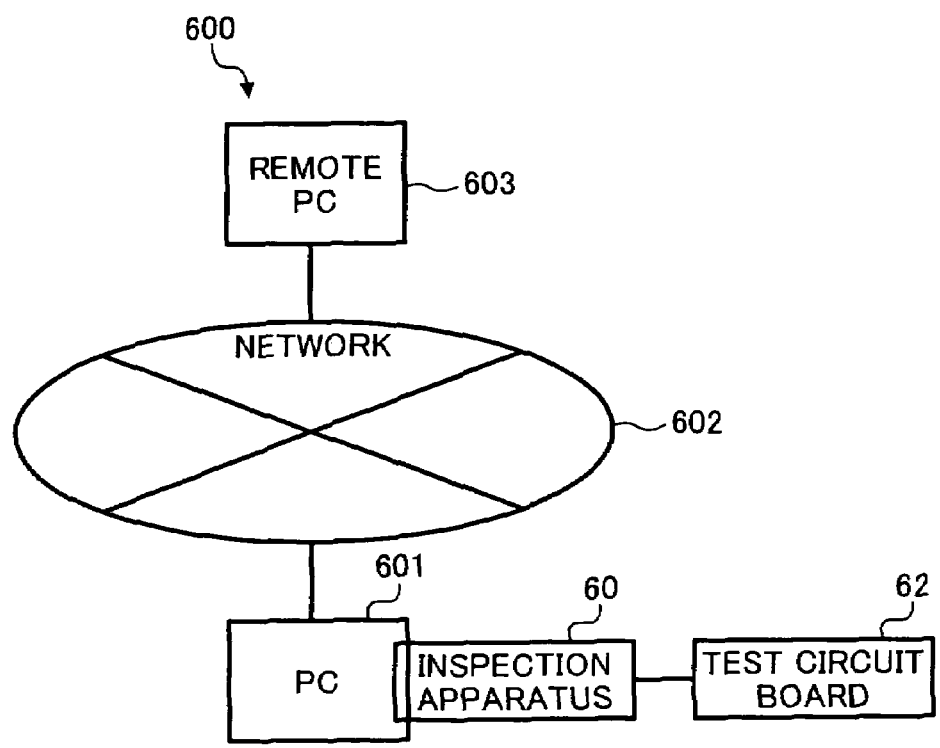
FIG. 6 is an illustration of a structure of a remote inspection system according to an exemplary embodiment of the present invention.

Referring to FIG. 6, a block diagram of a system structure of a remote inspection system 600 according to an exemplary embodiment of the present invention is described.

In FIG. 6, the remote inspection system 600 generally includes a local personal computer (PC) 601, a network 602, and a remote personal computer (PC) 603.

The local PC 601 has functions identical to those described in the embodiments with reference FIGS. 1 through 5. The local PC 601 is connected with an inspection apparatus 60 with a monitor function incorporated therein, by an interfacing device, such as a device complying with an interface protocol, such as peripheral component interconnect (PCI), Internet security and acceleration (ISA) and personal computer memory card international association (PCMCIA) as well as a wireless local area network (LAN) interface and an infrared communication interface. The inspection apparatus 60 inspecting a test circuit board 62 has functions identical to the inspection apparatuses 10 through 50 described in the embodiments with reference to FIGS. 1 through 5, respectively.

The network 602 is a network, such as a LAN, a wide area network (WAN), etc., connecting the local PC 601 with the remote PC 603 in FIG. 6.

The remote PC 603 may be located at a site different from the local PC 601. The remote PC 603, however, is connected with the local PC 601 by the network 602 as described above, and issues instructions to the local PC 601 through the network 602.

Operations of the remote inspection system 600 of FIG. 6 are described below.

In FIG. 6, the local PC 601 is located at a site and the remote PC 603 is located at a different site, and the local PC 601 and the remote PC 603 are connected with each other by the network 602. When the remote PC 603 sends test data corresponding to the test circuit board 62 to the local PC 601 by the network 602, the local PC 601 receives and downloads the test data to the inspection apparatus 60 so that the inspection apparatus 60 may perform inspections on the test circuit board 62.

Further, the inspection apparatus 60 performs a monitoring operation of conditions of monitor signals, and transmits result data obtained through the monitoring operation to the remote PC 603 by the network 602.

With the above-described system structure of FIG. 6, the remote inspection system 600 may control inspections of the test circuit board 62 from the remote PC 603 by issuing instructions therefrom to the local PC 601 connected by the network 602. The remote inspection system 600 further makes it possible that the remote PC 603 can remotely monitor the conditions of the monitor signals obtained between the inspection apparatus 60 and the test circuit board 62.

The present invention is not restricted to only those systems described above. For example, it would be possible to add the memory 57 to the inspection apparatus 10 of FIG. 1 or the inspection apparatus 20 of FIG. 2 so that the inspection apparatus 50 of FIG. 5 would be configured.

Additionally, the signal line directly connecting the PCI interface 1 with the buffer selector 5 of the inspection apparatus 20 of FIG. 2 may be omitted. This applies not only to the signal line 8a of the inspection apparatus 20 of FIG. 2, but also to that of the inspection apparatus 30 of FIG. 3 and the inspection apparatus 40 of FIG. 4. Further, those inspection apparatuses 20, 30 and 40 may be applied as the inspection apparatus 60 included in the remote inspection system 600 of FIG. 6.

Additionally, the PCI interface 1 of the inspection apparatus 10 of FIG. 1 may be a wireless interface connector connecting with personal computers on the wireless LAN. This applies not only to the inspection apparatus 10 of FIG. 1 but also to the inspection apparatuses 20, 30, 40 and 50 of FIGS. 2, 3, 4 and 5, respectively.

Numerous additional modifications and variations are possible in light of the above teachings. It is therefore to be understood that within the scope of the appended claims, the disclosure of this patent specification may be practiced otherwise than as specifically described herein.

The invention claimed is:

1. An inspection apparatus, comprising:
    an interface configured to interface with an external device providing at least one source signal;
    an inspection mechanism configured to perform an inspection of a circuit board externally connected to the inspection mechanism using the at least one source signal sent from the external device by the interface and at least one response signal returned from the circuit board, to verify whether the circuit board is accurately functioning; and
    a signal buffer mechanism configured to monitor and store the at least one source signal and response signal at points of respective connection lines between the inspection mechanism and the circuit board.

2. The inspection apparatus according to claim 1, wherein the inspection mechanism receives the at least one source signal from the external device by the interface, outputs the at least one source signal to the circuit board, receives the at least one response signal from the circuit board, and verifies functional accuracy of the circuit board based on the at least one source and response signals.

3. The inspection apparatus according to claim 1, wherein the inspection mechanism is further configured to transmit a result of the inspection to the external device by the interface, and the signal buffer mechanism is further configured to transmit the at least one source signal and response signal to the external device by the interface.

4. The inspection apparatus according to claim 1, further comprising:
a counter configured to repeatedly count up to a predetermined number, to receive at least one of the at least one source signal and response signal selectively sent from the signal buffer mechanism, and to transmit the at least one of the at least one source signal and response signal to the external device by the interface each time the counter counts up to the predetermined number.

5. The inspection apparatus according to claim 1, further comprising:
a plurality of counters, each configured to repeatedly count up to a respective predetermined number, to receive at least one of the at least one source signal and response signal selectively sent from the signal buffer mechanism, and to transmit the at least one of the at least one source signal and response signal to the external device by the interface each time the counter counts up to the respective predetermined number.

6. The inspection apparatus according to claim 1, further comprising:
a first counter configured to count during a predetermined time period a time length of a high-level signal in one of the at least one source signal and response signal selectively sent from the signal buffer mechanism and to transmit the time length of the high-level signal counted by the first counter to the external device by the interface; and
a second counter configured to count during the predetermined time period a time length of a low-level signal in the one of the at least one source signal and response signal selectively sent from the signal buffer mechanism and to transmit the time length of the low-level signal counted by the first counter to the external device by the interface.

7. The inspection apparatus according to claim 6, further comprising:
a memory configured to receive signals representing the time length of the high-level signal output from the first counter and the time length of the low-level signal output from the second counter and at least one of the at least one source signal and response signal sent from the signal buffer mechanism, and to transmit the received signals in a predetermined screen frame to the external device by the interface.

8. The inspection apparatus according to claim 1, wherein the interface complies with at least one of interface protocols of peripheral component interconnect, Internet security and acceleration, and personal computer memory card international association.

9. An inspection apparatus, comprising:
means for interfacing between the inspection apparatus and an external device;
means for performing an inspection of a circuit board using at least one source signal provided by the external device and at least one response signal sent back from the circuit board, to verify whether the circuit board is accurately functioning; and
means for monitoring and storing the at least one source signal and response signal at points between the inspection apparatus and the circuit board.

10. The inspection apparatus according to claim 9, wherein during performing the inspection the means for performing outputs the at least one source signal to the circuit board, receives the at least one response signal from the circuit board, and verifies functional accuracy of the circuit board based on the at least one source signal and response signal.

11. The inspection apparatus according to claim 9, wherein the means for performing transmits a result of the inspection to the external device, and the means for monitoring transmits the at least one source signal and response signal to the external device.

12. The inspection apparatus according to claim 9, further comprising:
means for counting repeatedly up to a predetermined number, receiving at least one of the at least one source signal and response signal selectively sent from the means for monitoring, and transmitting the at least one of the at least one source signal and response signal to the external device each time the means for counting counts up to the predetermined number.

13. The inspection apparatus according to claim 9, further comprising:
a plurality of means for counting, each of the plurality of means for counting repeatedly counting up to a respective predetermined number, receiving at least two of the at least one source signal and response signal selectively sent from the means for monitoring, and transmitting the at least two of the at least one source signal and response signal to the external device each time the plurality of means for counting counts up to the respective predetermined number.

14. The inspection apparatus according to claim 9, further comprising:
first means for counting during a predetermined time period a time length of a high-level signal in one of the at least one source signal and response signal selectively sent from the means for monitoring, and transmitting the time length of the high-level signal counted to the external device; and
second means for counting during the predetermined time period a time length of a low-level signal in the one of the at least one source signal and response signal selectively sent from the means for monitoring, and transmitting the time length of the low-level signal counted to the external device.

15. The inspection apparatus according to claim 14, further comprising:
means for receiving signals including the time length of the high-level signal output from the first means for counting and the time length of the low-level signal output from the second means for counting and at least one of the at least one source signal and response signal sent from the means for monitoring, and transmitting the received signals in a predetermined screen frame to the external device.

16. The inspection apparatus according to claim 9, wherein the means for interfacing complies with at least one of interface protocols of peripheral component interconnect, Internet security and acceleration, and personal computer memory card international association.

17. A method of board inspecting, comprising:
receiving at least one source signal from an external device with an interface;
performing an inspection of a circuit board by an inspection mechanism using the at least one source signal provided by the external device and at least one response signal sent back from the circuit board, to verify whether the circuit board is accurately functioning;

monitoring the at least one source signal and response signal at points of respective connection lines between the inspection mechanism and the circuit board; and storing the at least one source signal and response signal monitored by the monitoring.

18. The method according to claim 17, wherein the performing includes:

outputting the at least one source signal to the circuit board;

receiving the at least one response signal from the circuit board; and verifying functional accuracy of the circuit board.

19. The method according to claim 17, further comprising:

transmitting a result of the inspection performed by the performing to the external device by the interface; and sending the at least one source signal and response signal to the external device by the interface.

20. The method according to claim 17, further comprising:

counting up to a predetermined number; and transmitting the at least one of the at least one source signal and response signal to the external device by the interface each time the counting performs counting up to the predetermined number.

21. The method according to claim 17, further comprising:

counting up to a predetermined number; and transmitting at least two of the at least one source signal and response signal to the external device by the interface each time the counting counts up to the predetermined number.

22. The method according to claim 17, further comprising:

counting during a predetermined time period a time length of a high-level signal in one of the at least one source signal and response signal and a time length of a low-level signal in the one of the at least one source signal and response signal; and transmitting signals representing the time lengths of the high-level and the low-level signals counted by the counting to the external device by the interface.

23. The method according to claim 22, further comprising:

receiving signals representing the time lengths of the high-level and low-level signals output from the counting and the corresponding one of the at least one source signal and response signal; and sending the received signals in a predetermined screen frame to the external device by the interface.

24. The method according to claim 17, wherein the interface complies with at least one of interface protocols of peripheral component interconnect, Internet security and acceleration, and personal computer memory card international association.

25. A remote inspection system, comprising:

a first data terminal connected to a network;

a second data terminal connected to the network and providing at least one source signal; and an inspection apparatus connected to the second data terminal and comprising:

an interface configured to interface with a second data terminal providing the at least one source signal;

an inspection mechanism configured to perform an inspection of a circuit board externally connected to the inspection mechanism using the at least one source signal sent from the second data terminal by the interface and at least one response signal returned from the circuit board, to verify whether the circuit board is accurately functioning; and a signal buffer mechanism configured to monitor and store the at least one source signal and response signal at points of respective connection lines between the inspection mechanism and the circuit board.

26. The remote inspection system according to claim 25, wherein the inspection mechanism receives the at least one source signal from the second data terminal by the interface, outputs the at least one source signal to the circuit board, receives the at least one response signal from the circuit board, and verifies functional accuracy of the circuit board based on the at least one source signal and response signal.

27. The remote inspection system according to claim 25, wherein the inspection mechanism is further configured to transmit a result of the inspection to the second data terminal by the interface, and the signal buffer mechanism is further configured to transmit the at least one source and response signals to the second data terminal by the interface.

28. The remote inspection system according to claim 25, wherein the inspection apparatus further comprises:

a counter configured to repeatedly count up to a predetermined number, to receive at least one of the at least one source signal and response signal selectively sent from the signal buffer mechanism, and to transmit the at least one of the at least one source signal and response signal to the second data terminal by the interface each time the counter counts up to the predetermined number.

29. The remote inspection system according to claim 25, wherein the inspection apparatus further comprises:

a plurality of counters, each configured to repeatedly count up to a respective predetermined number, to receive at least one of the at least one source signal and response signal selectively sent from the signal buffer mechanism, and to transmit the at least one of the at least one source signal and response signal to the second data terminal by the interface each time the counter counts up to the respective predetermined number.

30. The remote inspection system according to claim 25, wherein the inspection apparatus further comprises:

a first counter configured to count during a predetermined time period a time length of a high-level signal in one of the at least one source signal and response signal selectively sent from the signal buffer mechanism and to transmit the time length of the high-level signal counted by the first counter to the second data terminal by the interface; and a second counter configured to count during the predetermined time period a time length of a low-level signal in the one of the at least one source signal and response signal selectively sent from the signal buffer mechanism and to transmit the time length of the low-level signal counted by the first counter to the second data terminal by the interface.

31. The remote inspection system according to claim 30, wherein the inspection apparatus further comprises:

a memory configured to receive signals representing the time length of the high-level signal output from the first counter and the time length of the low-level signal output from the second counter and at least one of the at least one source signal and response signal sent from the signal buffer mechanism, and to transmit the received signals in a predetermined screen frame to the second data terminal by the interface.

32. The remote inspection system according to claim 25, wherein the interface complies with at least one of interface protocols of peripheral component interconnect, Internet security and acceleration, and personal computer memory card international association.

33. The remote inspection system according to claim 25, wherein
the second data terminal provides the at least one source signal in accordance with a request sent from the first data terminal in the network.

34. A remote inspection system, comprising:
a first data terminal connected to a network;
a second data terminal connected to the network and providing at least one source signal; and
an inspection apparatus connected with the second data terminal and comprising:
means for interfacing between the inspection apparatus and a second data terminal;
means for performing an inspection of a circuit board using the at least one source signal provided by the second data terminal and at least one response signal sent back from the circuit board, to verify whether the circuit board is accurately functioning; and
means for monitoring and storing the at least one source signal and response signal at points between the inspection mechanism and the circuit board.

35. The remote inspection system according to claim 34, wherein during the inspection the means for performing outputs the at least one source signal to the circuit board, receives the at least one response signal from the circuit board, and verifies functional accuracy of the circuit board based on the at least one source and response signals.

36. The remote inspection system according to claim 34, wherein the means for performing transmits a result of the inspection to the second data terminal, and the means for monitoring transmits the at least one source signal and response signal to the second data terminal.

37. The remote inspection system according to claim 34, wherein the inspection apparatus further comprises:
means for counting repeatedly up to a predetermined number, receiving at least one of the at least one source signal and response signal selectively sent from the means for monitoring, and transmitting the at least one of the at least one source signal and response signal to the second data terminal each time the means for counting counts up to the predetermined number.

38. The remote inspection system according to claim 34, wherein the means for counting repeatedly counts up to the predetermined number, receives at least two of the at least one source signal and response signal selectively sent from the means for monitoring, and transmits the at least two of the at least one source signal and response signal to the second data terminal each time the means for counting counts up to the predetermined number.

39. The remote inspection system according to claim 34, wherein the inspection apparatus further comprises:
first means for counting during a predetermined time period a time length of a high-level signal in one of the at least one source signal and response signal, and transmitting the time length of the high-level signal counted to the second data terminal; and
second means for counting during the predetermined time period a time length of a low-level signal in the one of the at least one source signal and response signal, and transmitting the time length of the low-level signal counted to the second data terminal.

40. The remote inspection system according to claim 39, wherein the inspection apparatus further comprises:
means for receiving signals including the time length of the high-level signal output from the first means for counting and the time length of the low-level signal output from the second means for counting and at least one of the at least one source signal and response signal sent from the means for monitoring, and transmitting the received signals in a predetermined screen frame to the second data terminal.

41. The remote inspection system according to claim 34, wherein the means for interfacing complies with at least one of interface protocols of peripheral component interconnect, Internet security and acceleration, and personal computer memory card international association.

42. A method of remote board inspection, comprising:
connecting a first data terminal providing a request, to a network;
connecting a second data terminal originating at least one source signal in accordance with the request from the first data terminal, to the network;
providing an inspection apparatus connected to the second data terminal;
receiving the at least one source signal from the second data terminal with an interface;
performing an inspection of a circuit board using the at least one source signal provided by the second data terminal and at least one response signal sent back from the circuit board, to verify whether the circuit board is accurately functioning;
monitoring the at least one source signal and response signal at points of respective connection lines between the inspection apparatus and the circuit board; and
second storing the at least one source signal and response signal monitored by the monitoring.

43. The method according to claim 42, wherein the performing includes:
outputting the at least one source signal to the circuit board;
receiving the at least one response signal from the circuit board; and
verifying functional accuracy of the circuit board.

44. The method according to claim 42, further comprising:
transmitting a result of the inspection performed by the performing to the second data terminal by the interface; and
sending the at least one source signal and response signal to the second data terminal by the interface.

45. The method according to claim 42, further comprising:
counting up to a predetermined number; and
transmitting the at least one of the at least one source signal and response signal to the second data terminal by the interface each time the counting counts up to the predetermined number.

46. The method according to claim 45, wherein the transmitting transmits at least two of the at least one source signal and response signal to the second data terminal by the interface each time the counting counts up to the predetermined number.

47. The method according to claim 42, further comprising:

counting during a predetermined time period a time length of a high-level signal in one of the at least one source signal and response signal and a time length of a low-level signal in the one of the at least one source signal and response signal; and transmitting signals representing the time lengths of the high-level and the low-level signals counted by the counting to the second data terminal by the interface.

48. The method according to claim 47, further comprising:

receiving signals representing the time lengths of the high-level and low-level signals output from the counting and the corresponding one of the at least one source signal and response signal; and sending the received signals in a predetermined screen frame to the second data terminal by the interface.

49. The method according to claim 42, wherein the interface complies with at least one of interface protocols of peripheral component interconnect, Internet security and acceleration, and personal computer memory card international association.

* * * * *